United States Patent [19]

Friedrich

[11] Patent Number: 5,755,667
[45] Date of Patent: May 26, 1998

[54] MAMMOGRAPHY ANTENNA FOR NUCLEAR MAGNETIC RESONANCE EXAMINATIONS

[75] Inventor: Axel Friedrich, Nuernberg, Germany

[73] Assignee: Siemens Aktiengesellschaft, Munich, Germany

[21] Appl. No.: 687,935

[22] Filed: Jul. 29, 1996

[30] Foreign Application Priority Data

Aug. 1, 1995 [DE] Germany .................. 195 28 260.4

[51] Int. Cl.⁶ .................................................. A61B 5/055
[52] U.S. Cl. ................................................. 600/421; 324/318
[58] Field of Search .......................... 128/653.1, 653.5; 324/318, 322; 343/742; 600/407, 421

[56] References Cited

U.S. PATENT DOCUMENTS

| | | |
|---|---|---|
| 4,467,282 | 8/1984 | Siebold . |
| 4,733,190 | 3/1988 | Dembinski . |
| 5,241,272 | 8/1993 | Friedrich . |
| 5,270,656 | 12/1993 | Roberts et al. . |
| 5,317,266 | 5/1994 | Meissner . |
| 5,361,765 | 11/1994 | Herlihy et al. . |
| 5,363,845 | 11/1994 | Chowdhury et al. . |
| 5,473,251 | 12/1995 | Mori ........................... 324/318 |
| 5,500,596 | 3/1996 | Grist et al. . |
| 5,502,387 | 3/1996 | McGill . |
| 5,515,855 | 5/1996 | Meyer et al. ................ 128/653.5 |
| 5,519,321 | 5/1996 | Hagen et al. . |
| 5,548,218 | 8/1996 | Lu . |
| 5,575,287 | 11/1996 | Eydelman .................... 128/653.5 |
| 5,602,557 | 2/1997 | Duerr . |
| 5,606,259 | 2/1997 | Potthast et al. ............... 324/378 |

FOREIGN PATENT DOCUMENTS

| | | |
|---|---|---|
| 0 565 178 | 10/1994 | European Pat. Off. . |
| 0 640 842 | 3/1995 | European Pat. Off. . |
| OS 36 35 006 | 4/1987 | Germany . |
| OS 42 26 814 | 2/1994 | Germany . |
| OS 43 25 206 | 2/1994 | Germany . |
| OS 33 23 657 | 9/1994 | Germany . |

*Primary Examiner*—Marvin M. Lateef
*Assistant Examiner*—Shawna J. Shaw
*Attorney, Agent, or Firm*—Hill & Simpson

[57] ABSTRACT

A mammography antenna for magnetic resonance examinations has an examination space with an opening for accepting a female breast, a conductor arrangement for transmitting and/or receiving magnetic high-frequency fields, and a compression arrangement spatially allocated to the conductor arrangement for compressing the breast during the magnetic resonance examination. The compression arrangement includes compression elements movably arranged in a holder part. The conductor arrangement includes first conductor segments that are connected to the compression elements, second conductor segments that are connected to the holder part, and electrical connections that connect the first conductor segments to the second conductor segments and/or connect the first conductor segments to one another.

14 Claims, 1 Drawing Sheet

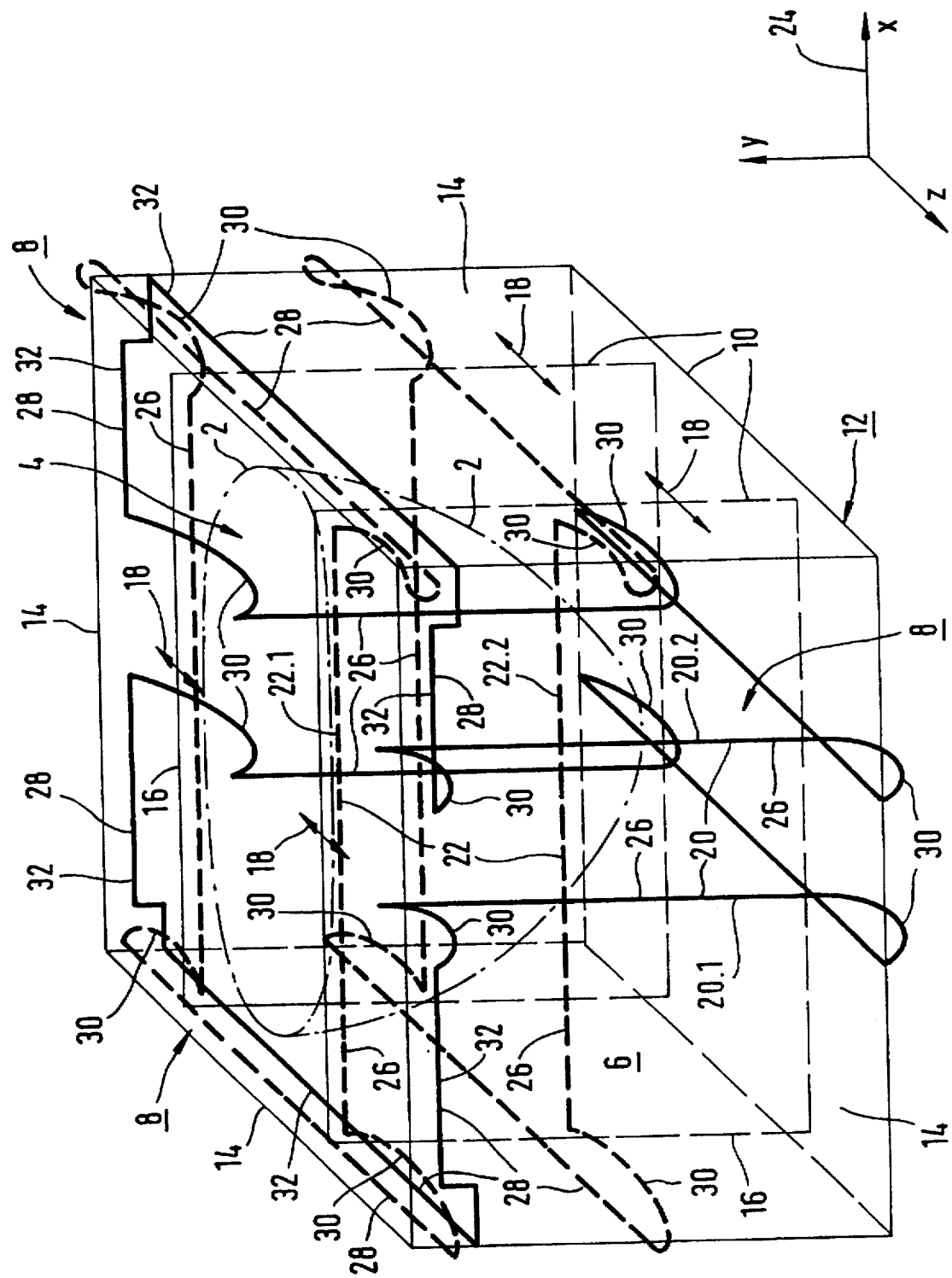

ced in the tuning and matching unit must
MAMMOGRAPHY ANTENNA FOR NUCLEAR MAGNETIC RESONANCE EXAMINATIONS

BACKGROUND OF THE INVENTION

Field of the Invention

The invention is directed to a mammography antenna for magnetic resonance examinations of the type having an examination space with an opening for the acceptance of a female breast, a conductor arrangement for transmitting and/or receiving magnetic high-frequency fields, and a compression means spatially allocated to the conductor arrangement for compressing the breast during the magnetic resonance examination, the compression means including compression elements movably arranged in a holder part.

German OS 43 25 206 discloses a mammography antenna of the above type. The compression means includes two compression plates that are arranged parallel and displaceable relative to one another and between which the breast can be fixed.

In a first embodiment, reception antennas are secured to the compression plates and can then be moved together with the compression plates. The reception antennas are situated in the immediate proximity of the portion to be examined and can thus supply magnetic resonance signals with a high signal-to-noise ratio. A disadvantage of this known antenna is that the resonant frequency fluctuates in a broad range due to the spatial displacement of the antennas. The adjustment elements in the connected tuning and matching unit must therefore have a correspondingly large range of adjustment. Additionally, lesions proximate to the chest wall lying farther toward peripheral regions can only be inadequately imaged.

In a second embodiment disclosed in German OS 43 25 206, the displaceable compression plates are situated within a stationary antenna arrangement. The range of fluctuation of the resonant frequency is in fact slight given the stationary antenna; due to the reduced filling factor, however, the mammography antenna in this embodiment supplies magnetic resonance signals with a low signal-to-noise ratio only in the case of a small breast.

German OS 33 23 657 discloses an antenna for a magnetic resonance apparatus that can be adapted to examination subjects of different sizes. An antenna, which can be varied in shape and size, is arranged on a carrier whose spacing from the examination subject can be set. To this end, a flexible antenna conductor is conducted via adjustable friction and pressure rollers, with the excess part of the antenna conductor being collected remote from the antenna. The current path is fashioned such that the uniformity (field homogeneity) and the signal-to-noise ratio in the received magnetic resonance signal are optimum at the various settings. The structural outlay and the space requirements given this antenna, however, are high.

SUMMARY OF THE INVENTION

An object of the present invention is to provide a simply constructed mammography antenna that can image the breast as well as regions proximate to the chest wall with a high signal-to-noise ratio.

This object is achieved in a mammography antenna constructed in accordance with the principles of the present invention having a conductor arrangement with first conductor segments that are connected to the compression elements, second conductor segments that are connected to the holder part, and electrical connection means connecting the first conductor segments to the second conductor segments and/or connecting the first conductor segments to one another. The conductor segments connected to the compression elements are moved together with the compression elements themselves and image the breast with a high signal-to-noise ratio. The stationary, second conductor segments connected to the holder part image the edge regions proximate to the chest wall.

In one embodiment the conductor arrangement has a first and second conductor sub-arrangements respectively having first and second magnetic axes these magnetic axes intersecting in the examination space at an essentially right angle. The reception signals of the two conductor sub-arrangements, which are combined after a 90° shift, have a high signal-to-noise ratio.

In another embodiment the first conductor sub-arrangement has a conductor region with a third magnetic axis that is aligned essentially parallel to the second magnetic axis. Although the first conductor sub-arrangement thereby has two magnetic axes residing approximately perpendicular to one another, the reception of the circularly polarized signals is not significantly disturbed. Additionally, an especially favorable guidance of the conductor segments (current path) belonging to the conductor region is possible with respect to the imaging of the regions proximate to the chest wall.

In a further embodiment, the conductor segments form coaxially spaced and symmetrical conductor loops. The homogeneity of the mammography antenna over the entire examination space is thus improved.

DESCRIPTION OF THE DRAWINGS

The single FIGURE shows a mammography antenna for nuclear magnetic resonance examinations constructed in accordance with the principles of the present invention.

DESCRIPTION OF THE PREFERRED EMBODIMENTS

The drawing shows a schematic, perspective view of an inventive mammography antenna. The mammography antenna is fashioned for implementing a magnetic resonance tomographic breast examination with the patient in a prone position. For examination, the breast 2 (indicated with broken lines in the drawing) is introduced into the examination space 6 of the mammography antenna via an opening 4.

A conductor arrangement 8 surrounds the examination space for transmitting and/or receiving magnetic high-frequency fields into or from the examination subject 2. A compression arrangement 10 for compressing the breast 2 during the magnetic resonance examination is spatially allocated to the conductor arrangement. The compression arrangement 10 includes a holder part 12. The holder part 12 is composed of four sidewalls 14 that form a rectangular frame surrounding the examination space 6. The dimensions of the sidewalls 14 are mainly determined by the anatomy of the examination subject 2. Openings can be worked into the sidewalls 14 in order to enable access to the breast, for example for the implementation of a biopsy. Two planar compression plates 16 are arranged parallel and movable relative to one another in the holder part 12. The mobility is symbolized by double arrows 18. The compression plates 16 can be provided with bores for the guidance of a biopsy needle; this, however, is not shown. The oppositely directed displacements can be effected, for example, by an opposed thread with a threaded rod that is connected to a manual drive.

The conductor arrangement 8 includes a first conductor sub-arrangement 20 with a first magnetic axis in the horizontal direction and a second conductor sub-arrangement 22 with a magnetic axis in the vertical direction. An x-y-z coordinate system whose x-axis indicates the horizontal direction and whose y-axis indicates the vertical direction is shown for illustrating the directions. The conductor sub-arrangements 20 and 22 respectively have coaxially spaced conductor loops 20.1,20.2 and 22.1,22.2. The conductor loops 20.1 and 20.2 in the first conductor sub-arrangement 20 are fashioned identically, as are the conductor loops 22.1 and 22.2 in the second conductor sub-arrangement 22.

The conductor loops 20.1,20.2 of the first conductor sub-arrangement 20 and the conductor loops 22.1,22.2 of the second conductor sub-arrangement 22 are composed of first conductor segments 26 that are secured to the compression plates 16 and second conductor segments 28 that are secured to the holder part 12. The movable, first conductor segments 26 and the fixed, second conductor segments 28 are connected to one another via electrical connectors 30 that are fashioned as flexible conductor bridges here. Dependent on the position of the compression plates 16, the flexible conductor bridges form conductor loops whose loop parts are guided in immediate proximity to one another, so that the surface they form is as small as possible. This has the advantage that the homogeneity of the image is not disturbed and only a slight additional amount of noise is captured. The electrical connectors 30 may alternatively be wiper contacts.

The conductor loops 20.1,20.2 of the first conductor sub-arrangement 20 have a conductor region 32 with a third, vertically aligned magnetic axis. The conductor region 32 is formed by second conductor segments 28 that are connected to the holder part 12 in the proximity of the opening 4. The conductor segments 28 of the conductor region 32 are aligned approximately parallel to the plane in which the opening 4 lies. The conductor region 32 especially receives magnetic resonance signals from the region proximate to the chest wall of the patient.

The drawing shows a single mammography antenna. For saving examination time, however, it is possible to provide two mammography antennas next to one another in order to be able to examine the patient without repositioning her.

Although modifications and changes may be suggested by those skilled in the art, it is the intention of the inventors to embody within the patent warranted hereon all changes and modifications as reasonably and properly come within the scope of their contribution to the art.

I claim as my invention:

1. A mammography antenna for conducting a magnetic resonance examination of a female breast, comprising:

a conductor arrangement for transmitting and receiving magnetic high-frequency fields;

a holder adapted to receive a female breast with a side of said holder adjacent a chest wall;

compression means allocated to the conductor arrangement for compressing the breast during the examination, the compression means including compression elements movably arranged in said holder for movement toward each other to compress the breast, received in said holder between the compression elements;

said conductor arrangement including first conductor segments which are connected to the compression elements and second conductor segments which are connected to the holder at said side of said holder adjacent the chest wall;

electrical connection means for connecting said first conductor segments to said second conductor segments for forming a loop comprised of said first and second conductor segments; and said first conductor segments having a field of view associated therewith which remains substantially unmodified as said compression elements are moved and said second conductor segments having a field of view associated therewith which varies as said compression elements are moved.

2. The improvement of claim 1 wherein said first conductor segments are mounted on said compression elements.

3. The improvement of claim 1 wherein said second conductor segments are mounted on said holder part.

4. The improvement of claim 1 wherein said first and second electrical connection means comprise flexible conductor segments.

5. The improvement of claim 1 wherein said conductor arrangement comprises a first conductor sub-arrangement having a first magnetic axis and a second conductor sub-arrangement having a second magnetic axis, said first and second magnetic axes intersecting in said examination space at an angle which is substantially a right angle.

6. The improvement of claim 5 wherein said opening is disposed in a plane, and wherein said first magnetic axis is aligned parallel to said plane.

7. The improvement of claim 6 wherein said first conductor sub-arrangement comprises a conductor region having a third magnetic axis aligned substantially parallel to said second magnetic axis.

8. The improvement of claim 5 wherein said first conductor sub-arrangement comprises a conductor region having a third magnetic axis aligned substantially parallel to said second magnetic axis.

9. The improvement of claim 5 wherein said conductor segments form coaxially spaced and symmetrical conductor loops.

10. The improvement of claim 9 wherein said first and second conductor sub-arrangements each comprise two of said symmetrical conductor loops.

11. The improvement of claim 1 wherein said conductor segments form coaxially spaced and symmetrical conductor loops.

12. The improvement of claim 1 wherein a portion of said second conductor segments are disposed adjacent said opening.

13. The improvement of claim 12 wherein said opening is disposed in a plane, and wherein said portion of said second conductor segments is aligned parallel to said plane.

14. The improvement of claim 1 wherein said compression elements comprise compression plates.

* * * * *